United States Patent [19]

Verheyen et al.

[11] Patent Number: 5,414,638

[45] Date of Patent: May 9, 1995

[54] PROGRAMMABLE INTERCONNECT ARCHITECTURE

[75] Inventors: Henry T. Verheyen, San Jose; Charles J. Kring, Jr., Sunnyvale; Robert Osann, Jr., San Jose, all of Calif.

[73] Assignee: Aptix Corporation, San Jose, Calif.

[21] Appl. No.: 993,331

[22] Filed: Dec. 18, 1992

[51] Int. Cl.6 .......................................... H03K 17/693
[52] U.S. Cl. ................................ 364/489; 364/488; 340/825.83
[58] Field of Search ............... 364/488, 489, 490, 491, 364/716; 307/465; 340/825.83; 370/53, 54

[56] References Cited

U.S. PATENT DOCUMENTS

| | | | |
|---|---|---|---|
| 4,695,999 | 9/1987 | Lebizay | 370/58 |
| 5,036,473 | 7/1991 | Butts et al. | 364/489 |
| 5,077,451 | 12/1991 | Mohsen | 174/261 |
| 5,212,652 | 5/1993 | Agrawal et al. | 364/489 |
| 5,231,588 | 7/1993 | Agrawal et al. | 364/489 |
| 5,233,539 | 8/1993 | Agrawal et al. | 364/489 |
| 5,255,203 | 10/1993 | Agrawal et al. | 364/489 |

OTHER PUBLICATIONS

*FPIC AX1024D (FPIC/D) Field Programmable Interconnect Component, Preliminary Data Sheet*, Aptix Corporation, Aug. 1992, v1.0.
*FPIC AX1024R (FPIC/R) Field Programmable Interconnect Component, Preliminary Data Sheet*, Aptix Corporation, Nov. 1992, v1.0.
*Programmable Interconnect, The Next Great Idea*, Aptix Corporation, 1992.
*Introduction to Programmable Interconnect*, Aptix Corporation, Jun. 1992, v1.0.
*FPCB AXB-GP2 General Purpose Field Programmable Circuit Board, Preliminary Data Sheet*, Aptix Corporation, Aug. 1992, v1.0.
R. Guo et al., *A 1024 Pin Universal Interconnect Array with Routing Architecture*, Proceedings IEEE 1992 Custom Integrated Circuit Conference, may 1992, pp. 4.5.1. through 4.5.4.

Primary Examiner—Vincent N. Trans
Attorney, Agent, or Firm—Skjerven, Morrill, MacPherson, Franklin & Friel; Michael Shenker

[57] ABSTRACT

A programmable interconnect system includes a two-level hierarchal structure of programmable interconnect chips on a circuit board. The first-level, or "local", interconnect chips are connected to user components. A plurality of second-level, or "global", interconnect chips interconnect the local interconnect chips so that every local chip is connected to every global chip. Such a system allows connecting any pin of any user component to any other pin of any user component by a conductive path passing through at most three interconnect chips. A large number of such paths are provided even in embodiments with a large number of interconnect chips.

33 Claims, 5 Drawing Sheets

PROGRAMMABLE INTERCONNECT ARCHITECTURE

BACKGROUND OF THE INVENTION

The present invention relates to interconnect systems, and more particularly to systems using programmable interconnect chips to establish electrical connections in circuit boards.

Over the last several years circuit-board-level system complexity has dramatically increased due to advances in the integrated circuit and discreet component technology. Such advances provide products with improved functionality, performance, integration and cost. However, they also make the system verification so complex as to become a significant bottle-neck in the development process.

To facilitate the board-level system verification, programmable interconnect systems have been proposed that use programmable interconnect chips to quickly and cheaply replicate the board functionality. The programmable interconnect chips are connected to other components of the board ("user components") and are programmed to provide the desired connections between the user components.

One such programmable interconnect system is disclosed in the U.S. patent application Ser. No. 07/410,194 filed Sep. 20, 1989 by Mohsen, now U.S. Pat. No. 5,377,124 set to issue on Dec. 27, 1994. In that system, every interconnect chip is connected to every other interconnect chip to provide a flexible interconnect architecture.

Another example of a programmable interconnect system is a channel-routing interconnect system disclosed in the U.S. Pat. No. 5,036,473 issued Jul. 30, 1991 to Butts et al. In that system, each user component chip is surrounded by, and connected to, interconnect chips. Another example is a partial crossbar interconnect system disclosed in the same patent. The partial crossbar system requires fewer interconnect chips but it generally does not allow connecting any pin of a user component to any other pin of a user component. For example, in the system of FIG. 7 of the Butts et al. patent, pin C of logic chip 1 can be connected only to pins C and D of logic chip 4 but not to pins A, B, E, F, G, H of chip 4.

It is desirable to provide an interconnect system which would allow connecting any pin of a user component to any other pin of a user component and which would provide a large number of low-delay conductive paths between user components.

SUMMARY OF THE INVENTION

The present invention provides an interconnect architecture that allows in some embodiments connecting any pin of a user component to any other pin of a user component and which provides a large number of low-delay conductive paths between user components.

The inventors have observed that the channel-routing interconnect system described above, when used with a large number of chips, may necessitate large delays in the nets connecting user components at opposite sides of the board. (A net is a set of pins connected together by conductive paths.) The large delays are caused by a large number of interconnect chips through which the net must pass. Further, as the number of chips becomes large, more nets become routed through the interconnect chips in the middle portion of the array, causing routing congestion.

Partial crossbar systems have lower delays but, as noted above, such systems generally do not allow connecting any pin of a user component to any other pin of a user component.

The above-described system in which every interconnect chip is connected to every other interconnect chip provides a low-delay conductive path between any two user components because any two user components can be connected by a path passing through at most two interconnect chips, that is, by a path of length at most two (the length of a path is the number of interconnect chips through which the path passes). However, the number of the length-two paths between any two given user component pins is small in systems with many interconnect chips because a given interconnect chip in such systems has but few pins available for being connected to any other given interconnect chip.

For example, in one such system, each interconnect chip has 936 programmable pins, i.e., 936 pins that can be programmably connected to each other; most programmable pins—785 in number—are reserved for connection to user components, and thus only 151 pins remain for connection to other interconnect chips. As the 151 pins must be divided between a large number of interconnect chips, few pins are available for connection to any given interconnect chip. Hence few length-two paths are provided between user components connected to different interconnect chips.

The present invention in some embodiments eliminates the deficiencies of the interconnect systems described above by providing a two-level hierarchical system of interconnect chips on a circuit board. The first-level, or "local", interconnect chips are connected to user components. A plurality of second-level, or "global", interconnect chips interconnect the local interconnect chips so that every local interconnect chip is connected to every global interconnect chip. Each global chip has less than one half of its programmable pins available for connection to user components, and most programmable pins of each global chip are available for connection to local chips. In some embodiments, the global chips have no programmable pins connected by interconnects to user components but are entirely dedicated to interconnecting local chips. By contrast, each local chip in some embodiments has more than one half of its programmable pins available for connection to user components and less than one half connected to the global chips.

The system allows connecting any pin of a user component to any other pin of a user component by a path having the length at most three such as a path passing through two local interconnect chips and one global interconnect chip. Moreover, in some embodiments, the number of such length-three paths is large and does not decrease as the number of interconnect chips increases. More particularly, in some embodiments, every local interconnect chip has a fixed number of pins dedicated to be connected to the global interconnect chips. This number of pins equals the number of length-three paths available to the user components connected to that local interconnect chip. When the number of local and global interconnect chips increases, the number of the length-three paths remains the same as long as the number of local interconnect chip pins connected to the global chips remains the same, even though the number of local chip pins connected to any given global chip may decrease. Thus, a large number of low-delay paths between any two user component pins are provided even in embodiments having many interconnect chips.

Other features and advantages of the invention are described below. The invention is defined by the appended claims.

DESCRIPTION OF THE PREFERRED EMBODIMENTS

Figure 1:
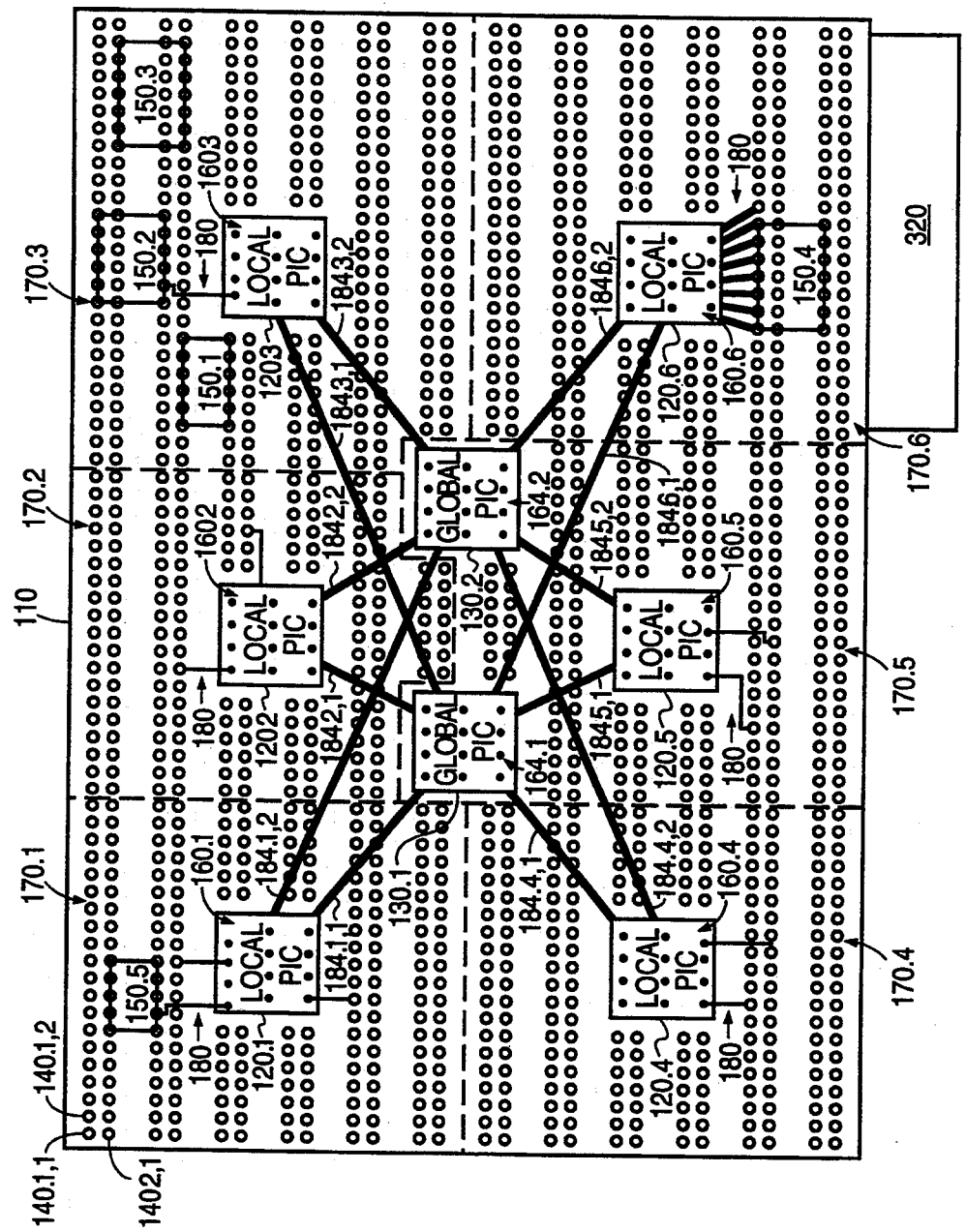
FIGS. 1–4 are schematic diagrams of programmable interconnect systems according to the present invention.

FIG. 1 illustrates schematically a programmable interconnect system that includes a circuit board 110 and 20 programmable interconnect chips (called herein programmable interconnect components, or PICs) 120.1 through 120.6, 130.1, 130.2. Circuit board 110 includes component contacts 140.1,1, 140.1,2, 140.2,1 and other such contacts for contacting conductive leads of user components. Each contact 140 is in some embodiments a socket for solderless insertion of a component lead. In other embodiments, the component leads are to be inserted and soldered. In still other embodiments, the contacts 140 are solder pads for surface mounting of the components. Other technologies are used in other embodiments. In some embodiments, board 110 combines component contacts of different types.

FIG. 1 illustrates five user components 150.1 through 150.5. Each component 150.i is an integrated circuit or a discrete electrical component, for example, a discrete resistor or capacitor.

Circuit board 110 includes also PIC contacts 160.1 through 160.6, 164.1, 164.2 for receiving the pins of respective PICs 120.1 through 120.6, 130.1, 130.2. PIC contacts for each PIC underlie the PIC. Other positioning of the PIC contacts relative to the PICs is used in other embodiments. Each PIC contact is a contact hole or a surface mounting pad similarly to contacts 140. Some embodiments of board 110 combine PIC contacts of different types.

Circuit board 110 includes six areas 170.1 through 170.6 corresponding to the respective PICs 120.1 through 120.6. Interconnects 180 each connect a unique component contact 140 in area 170.i to a unique PIC contact 160.i of the corresponding local PIC 120.i. For simplicity, only a few interconnects are shown. In some embodiments, each interconnect 180 is a piece of wire. In other embodiments, each interconnect 180 is a printed conductive trace. Other embodiments combine interconnects of different types. In some embodiments, circuit board 110 is a multilayer printed circuit board in which the interconnects 180 occupy different layers. Some embodiments of the circuit board technology suitable for board 110 are disclosed in the U.S. Pat. No. 5,377,124 set to issue on Dec. 27, 1994 by Mohsen which is hereby incorporated herein by reference; and in *FPCB TM AXB-GP2 General Purpose Field Programmable Circuit Board, Preliminary Data Sheet* (Aptix Corporation of San Jose, Calif., August 1992, v1.0) which is hereby incorporated herein by reference. Some embodiments use custom tooled printed circuit boards such as described in the U.S. Pat. No. 5,077,451 issued Dec. 31, 1991 to Mohsen and hereby incorporated herein by reference. An FPCB compiler is available from Aptix Corporation to route the board interconnects to achieve a desired interconnect capability.

In some embodiments, areas 170.i are non-contiguous areas, and some or all areas 170.i are not adjacent to the corresponding PICs 120.i.

Each PIC 120.i, 130.i has a number of programmable pins that can be programmably connected by the PIC to each other. In some embodiment, one or more of PICs 120.i, 130.i are of type AX1024D (Trademark) available from Aptix Corporation of San Jose, Calif. A PIC of type AX1024D has 1,024 pins of which 936 can be electrically interconnected in any configuration. In particular, for any group of disjoint subsets of the 936 programmable pins, the PIC can be programmed to electrically connect together the pins of each subset while electrically isolating the subsets from each other. PICs of type AX1024D are described in *FPIC TM AX1024D (FPIC/D) Field Programmable Interconnect Component, Preliminary Data Sheet* (Aptix Corporation, August 1992, v1.0) which is hereby incorporated herein by reference. In some embodiments, one or more of PICs 120.i, 130.i are of type AX1024R (Trademark) also available from Aptix Corporation. PICs of type AX1024R are described in *FPIC TM (FPIC/R) AX1024R Field Programmable Interconnect Component, Preliminary Data Sheet* (Aptix Corporation, November 1992, v1.0) which is hereby incorporated herein by reference. Some embodiments use PICs described in the U.S. patent application Ser. No. 07/764,263 filed Sep. 23, 1991 by Mohsen, now abandoned, the U.S. Pat. No. 5,377,124 set to issue on Dec. 27, 1994 by Mohsen, and the article by R. Guo et al., *A 1024 Pin Universal Interconnect Array with Routing Architecture*, Proceedings IEEE 1992 Custom Integrated Circuit Conference, May 1992, pages 4.5.1 through 4.5.4. Both patent applications and the article are hereby incorporated herein by reference.

Some PIC embodiments including the PICs of type AX1024D and AX1024R are reprogrammable; other embodiments such as those utilizing some fuse and antifuse technologies are one-time programmable.

Some embodiments of the system of FIG. 1 combine PICs of different kinds.

Additional interconnects (not shown) connect the PICs to a connector (not shown) which provides an interface to a system (not shown) that programs the PICs. In some embodiments, some or all the PICs are daisy chained to allow serial entry of programming data through one pin of one of the PICs. Each PIC can pass signals having any voltage from 0 volts to 5 volts in some embodiments.

Local PICs 120.i are interconnected through global PICs 130.i. Each line 184.i,j represents one or more interconnects, such as wires or printed traces, each of which connects a unique PIC contact 160.i to a unique PIC contact 164.j. The schematic representation of FIG. 1 notwithstanding, interconnects 184.i,j do not contact the component contacts 140. Each interconnect in some embodiments consists of one or more segments of straight lines; each segment extends horizontally or vertically.

Thus each local PIC 120.i is connected to each global PIC 130.j. In some embodiments, each PIC 120.i, 130.j has 936 pins that can be programmably interconnected; each local PIC 120.i has 50 pins connected to global PIC 130.1 and 50 pins connected to global PIC 130.2, for a total of 100 pins connected to the global PICs. Some or all of the remaining 836 programmable pins of each local PIC are connected to component contacts 140. Thus any two user components connected to different local PICs, such as components 150.1 and 150.5, can be interconnected by 100 paths—50 paths through each global PIC 130.j. Each path has length three as it includes two local PICs and one global PIC.

To implement a "global" net, that is, a net routed through a global PIC, the global PIC is programmed to connect together its pins connected to different "global" interconnects 184.i,j. (A "global" interconnect is an interconnect connecting two PICs. A "local" interconnect is an interconnect connecting a PIC to a user component. Interconnects 180 in FIG. 1 are local.) For example, a net interconnecting user components 150.5, 150.2 and 150.4 can be routed through global PIC 130.1. To implement such a net, PIC 130.1 is programmed to interconnect a pin connected to one of global interconnects 184.1,1, a pin connected to one of global interconnects 184.3,1, and a pin connected to one of global interconnects 184.6,1. Thus in many applications, global PICs are programmed to interconnect pins connected to different global interconnects. By contrast, local PICs connect pins that are connected to local interconnects 180 to pins that are connected to global interconnects 184.i,j, but local PICs do not connect together multiple pins connected to different global interconnects.

In some applications, however, a local PIC is programmed to interconnect its pins connected to different global interconnects. For example, a net interconnecting components 150.5, 150.2 and 150.4 is routed in some applications through an interconnect 184.1,1, PIC 130.1, an interconnect 184.3,1, PIC 160.3, interconnect 184.3,2, PIC 130.2, an interconnect 184.6,2, and PIC 160.6. In such an application, local PIC 160.3 is programmed to connect a pin connected to an interconnect 184.3,1 to a pin connected to an interconnect 184.3,2. Such a net is used in some applications for signals driven by user component 150.2.

The components connected to the same local PIC, such as components 150.1 through 150.3, can be interconnected through the local PIC by paths of length 1. Moreover, different pins of the same user component that are connected to the same local PIC can be connected through the local PIC by a path of length 1.

Figure 2:
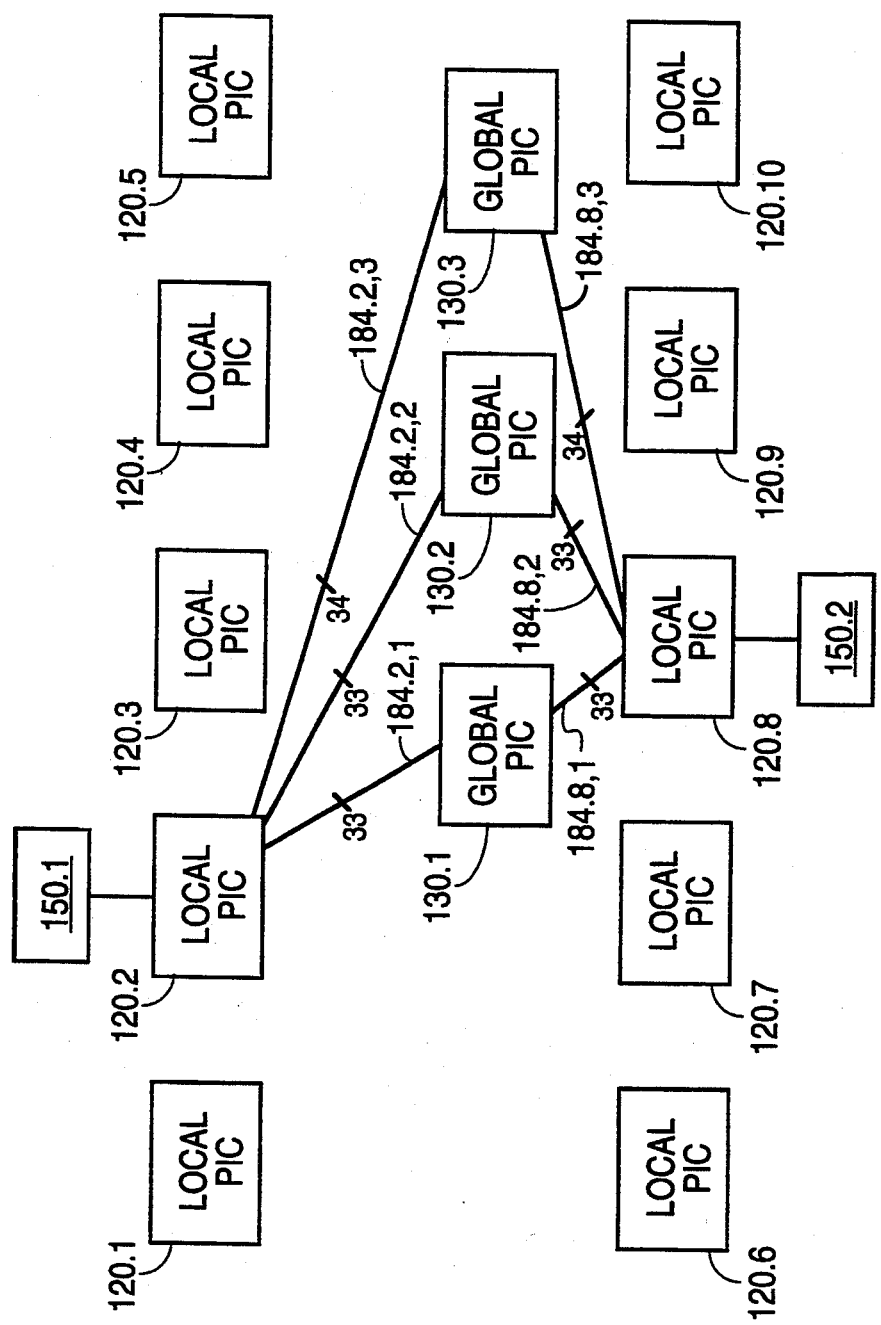

The interconnect architecture of FIG. 1 in which every local PIC is connected to every global PIC scales well when the number of local PICs increases because the number of paths of length three between any two user components connected to different local PICs remains the same. FIG. 2 illustrates a structure with ten local PICs 120.i and three global PICs 130.j. Every local PIC 120.i has 100 pins connected to all the global PICs 130.j by interconnects 184.i,j. For simplicity, only interconnects 184.2,j and 184.8,j are shown. Every local PIC has 33 pins connected to PIC 130.1, 33 pins connected to PIC 130.2, and 34 pins connected to PIC 130.3. Thus, 100 paths of length three are available to interconnect user components 150.1 and 150.2 that are connected to different local PICs. The number of such paths—100—is the same as in FIG. 1 as long as each local PIC 120.i has the same number of pins connected to the global PICs.

The number of such paths can be increased simply by connecting more pins of a local PIC to the global PICs. For example, in some embodiments using PICs with 936 programmable pins, each local PIC has 300 pins connected to the global PICs. The number of pins connected to component contacts 140 is 636. The reduction in the number of the local PIC pins available for connection to component contacts 140 can be compensated by providing additional local PICs. A flexible, easily expandable architecture is thus provided.

Since most or all of the programmable pins of global PICs 130.j are not connected to the component contacts 140, most or all of the programmable pins of the global PICs are available for connection to the local PICs. New local PICs can be added until the number of the programmable pins of the global PICs is exhausted, at which point global PICs can be added to accommodate more local PICs. When the number of user components is increased, the additional local and global PICs provide additional conductive paths thus avoiding routing congestion.

In some embodiments, some interconnects connect local PICs directly and not through a global PIC. Such an architecture allows implementing delay-critical nets by providing shorter conductive paths—of length two—between the user components connected to different local PICs.

In some embodiments, global PICs are interconnected by one or more interconnects.

In some embodiments, a single pin of a local PIC is connected by interconnects to different global PICs. In some embodiments, the pins of different local PICs are connected by interconnects to the same pin of a global PIC.

In some embodiments, a single contact 140 is connected by interconnects to two or more local PICs. This allows a low-delay and low-skew signal delivery from the component contact to components connected different local PICs.

In some embodiments, a single pin of a local PIC is connected by interconnects to multiple contacts 140. This architecture is used in some embodiments to deliver an address signal to different memory chips through the same local PIC.

In some embodiments, some contacts 140 are interconnected by interconnects to rout delay- and skew-sensitive signals without PICs. This architecture is used in some embodiments to implement clock trees and busses without using PICs.

In some embodiments, the components are mounted so that different pins of the same component are connected to different local PICs.

In FIG. 2, the number of pins of a global PIC connected to one local PIC is different for different global PICs—that number is 33 for PICs 130.1 and 130.2 and 34 for PIC 130.3. However, for a given global PIC this number is the same for all the local PICs. In some embodiments, this number is different for different local PICs even for the same global PIC.

Figure 3:
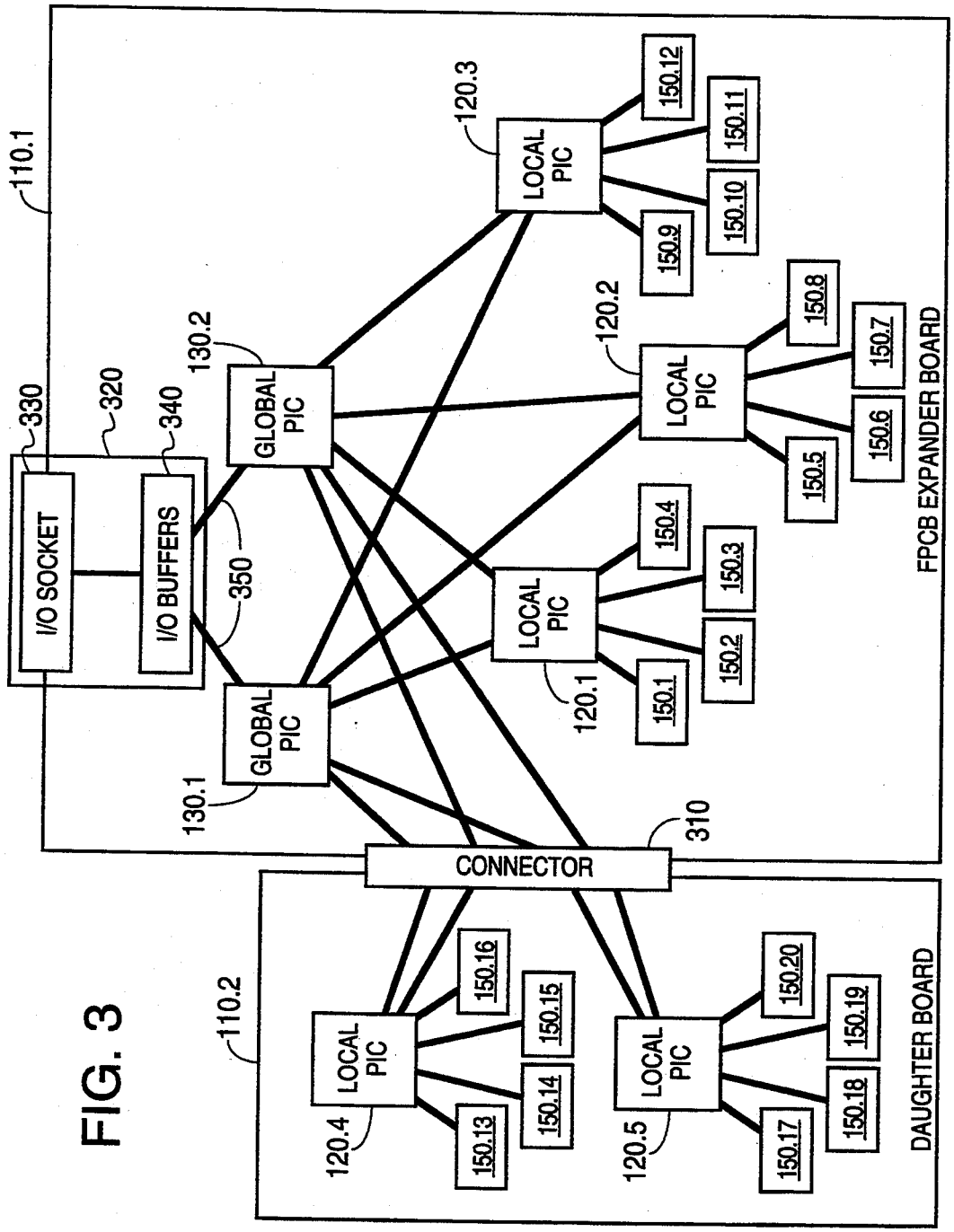

Some embodiments span more than one circuit boards as illustrated by FIG. 3. In FIG. 3, global PICs 130.1, 130.2 and local PICs 120.1, 120.2, 120.3 are mounted on circuit board 110.1. Local PICs 120.4, 120.5 are mounted on circuit board 110.2. Each circuit board 110.i is similar to circuit board 110 of FIG. 1. Connector 310 connects the two boards to connect each local PIC 120.4, 120.5 to each global PIC.

Each local PIC 120.i is connected to four user components 150. In some embodiments, each user component is a field programmable gate array (FPGA). Such FPGAs are available from, for example, QuickLogic Corporation of Santa Clara, Calif., Xilinx Corporation of Santa Clara, Calif. and Actel Corporation of Sunnyvale, Calif.

More than two circuit boards are used in some embodiments.

In some embodiments, global PICs are distributed among different circuit boards. Further, user components on one board are connected in some embodiments to local PICs on another board. Interconnects and connectors connect each local PIC to each global PIC.

FIGS. 1 and 3 show also a connection module 320 mounted on a circuit board for connecting the board components to off-board devices. As shown in FIG. 3, module 320 includes an I/O port 330 for plugging in off-board devices and I/O buffers 340 for actively driving signals between the I/O port and the PICs. In some embodiments, I/O port 330 is a socket for plugging in a communication network such as Ethernet, or a bus such as a VME bus. I/O buffers 340 are connected by interconnects 350 to global PICs 130.1, 130.2 for efficient communication between the off-board devices and the user components 150. In some embodiments, some or all I/O buffers are connected to local PICs and/or to user components.

Figure 4:
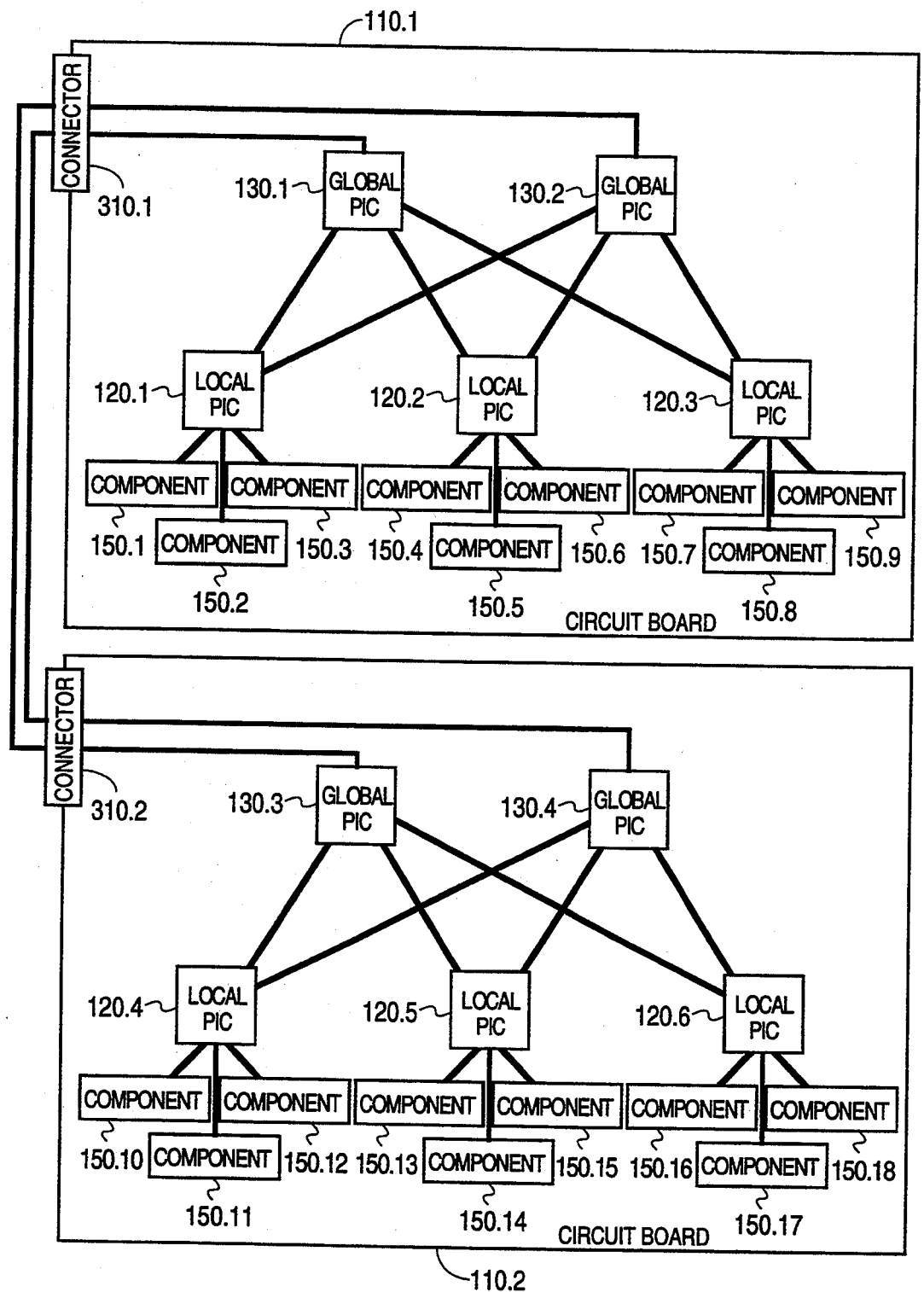

In FIG. 4, global PICs 130.1, 130.2 and local PICs 120.1, 120.2, 120.3 are mounted on circuit board 110.1. Global PICs 130.3, 130.4 and local PICs 120.4, 120.5, 120.6 are mounted on circuit board 110.2. User components 150.1 through 150.18 are mounted on the respective circuit boards. In each board, each local PIC is connected to each global PIC. Global PICs 130.1, 130.2 are connected to global PICs 130.3, 130.4 through connectors 310.1, 310.2. Components 150 on different boards 110 can be interconnected by a path of length four—a path passing through two global PICs and two local PICs.

The systems of FIGS. 1–4 allow connecting any pin of any user component to any other pin of any user component. Thus in FIG. 1, any pin of component 150.1 can be connected to any pin of component 150.5 even in those embodiments in which one or both of components 150.1, 150.5 are each connected to more than one local PICs. Thus the architecture of FIGS. 1–4 is well suited for fixed-pin user components, such as memories and processors, in which the function of each pin cannot be changed depending on desired pin connections. More particularly, since the systems of FIGS. 1–4 can connect any user pin to any user pin, these systems do not limit the placement of the fixed-pin components.

The systems of FIGS. 1–4 are also suitable for assignable-pin components such as FPGAs. Even though a function of an assignable pin can be changed to suit an interconnect system, assignment of a pin function based on the interconnect system typically reduces the FPGA capacity because the assignment may reduce the available routing resources of the FPGA and the number of available FPGA gates. Because the systems of FIGS. 1–4 can connect any user pin to any other user pin, they are less likely to reduce the assignable-pin component capacity.

Figure 5:
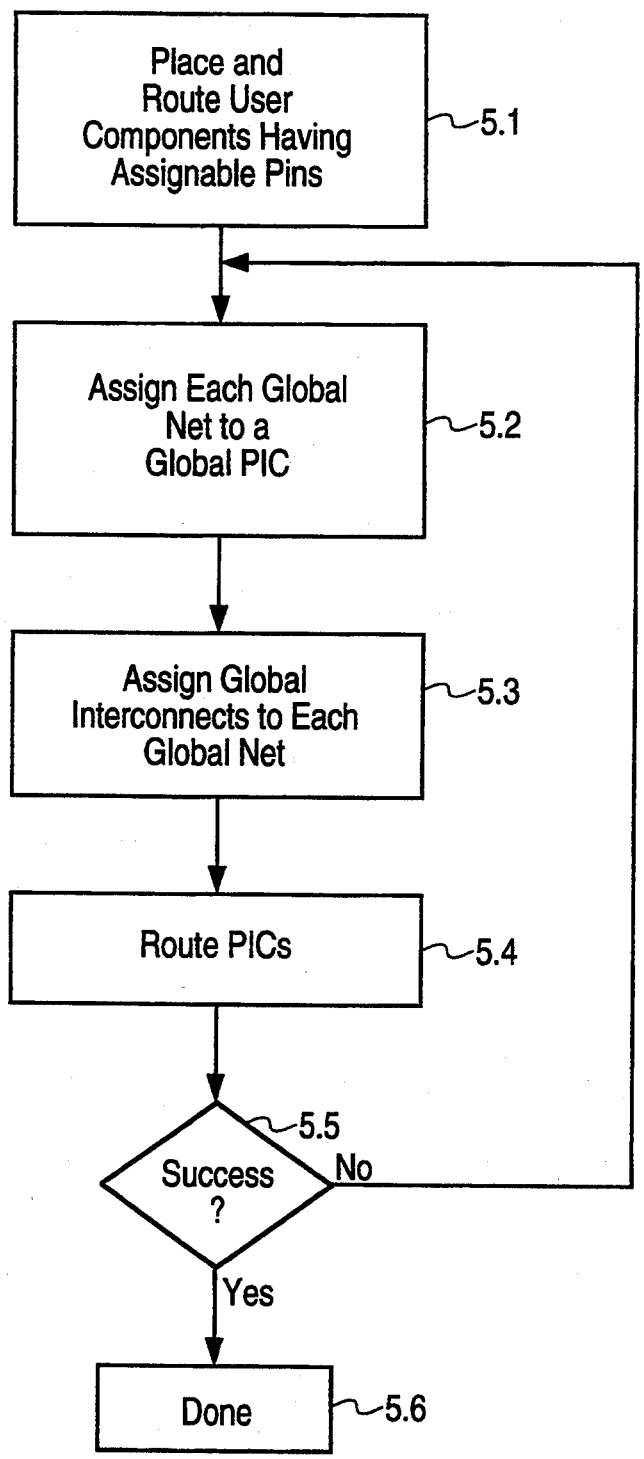
FIG. 5 if a flow diagram illustrating a present-invention method of routing a programmable interconnect system having one or more user components with one or more assignable pins.

In particular, the placement and routing of the assignable-pin components can be performed before the routing of the PICs as illustrated by FIG. 5. FIG. 5 is a flow diagram of one method of routing a programmable interconnect system with assignable-pin components. The method is implemented in some embodiments by a program executed by a computer. At step 5.1, the placement and routing is performed for assignable-pin components. The assignable-pin assignment is thereby accomplished based on the desired logic.

At step 5.2, each global net in the user-specified netlist is assigned to a global PIC. This assignment is performed in some embodiments so that the global nets are evenly distributed among global PICs to facilitate the routability of each global PIC.

At step 5.3, global interconnects are assigned to the global nets. The global interconnects are assigned in some embodiments so as to maximize the routability of the global and local PICs, that is, to minimize the sum of the net bounding boxes (a bounding box is the smallest box enclosing every pin in the net). Another goal in some embodiments is to minimize the delay through each PIC. In some embodiments, and in particular in embodiments using PICs of type AX1024D or AX1024R described above, the pins of each PIC are arranged in rows and columns, and in order to minimize the delay the global interconnects are assigned so that in each PIC the pins interconnected by the net are in the same pin row or the same pin column of the PIC. Thus in each local PIC, the pin connected to a local interconnect and the pin connected to a global interconnect are in the same row or in the same column of pins. Each global PIC also connects pins in the same row or column. Such interconnect selection helps minimize the distance between the interconnected pins of each PIC. The interconnect assignment of step 5.3 is performed based on the pin assignment obtained at step 5.1 and on the user specified netlist.

At step 5.4, the global and local PIC routing is performed. The routing resources of each PIC through which the nets pass are assigned to the nets.

At step 5.5, a check is made if the routing was successful. If not, steps 5.2 and 5.3 are repeated to increase the routability of one or more PICs. Otherwise, the computer program passes to the termination step 5.6.

The systems and methods described above are highly suitable for interconnecting digital signals because digital signals are not highly sensitive to voltage changes caused by the PIC resistances in some embodiments.

While the invention has been illustrated with respect to the embodiments described above, other embodiments and variations are within the scope of the invention. In particular, the invention is not limited by the number and type of PICs, user components and circuit boards. Nor is the invention limited by the number of programmable pins connected to PICs or to user components. In some embodiments, one or more global PICs have less than one third programmable pins connected to user component contacts. In some embodiments, one or more local PICs have less than one third programmable pins connected to the global PICs. Other programmable pin proportions are used in other embodiments. The structures and methods described above are suitable both for system verification and for final manufactured products. Other embodiments and variations are within the scope of the invention which is defined by the following claims.

What is claimed is:

1. A structure comprising:
   a first circuit board;
   a plurality of contacts on said circuit board for contacting one or more user components;
   a first plurality of programmable interconnect chips (PICHs) each of which has a plurality of programmable leads contacting said first circuit board such that each PICH can programmably connect any one of its programmable leads to another one of its programming leads;

a first plurality of conductive interconnects each of which connects one of said user-component contacts to a programmable lead of a PICH of said first plurality so that each said PICH has a programmable lead connected to one or more of said user-component contacts;

a second plurality of PICHs each of which has a plurality of programmable leads contacting said first circuit board such that each PICH of said second plurality can programmably connect any one of its programmable leads to another one of its programmable leads; and a second plurality of conductive interconnects each of which connects a programmable lead of a PICH of said second plurality to a programmable lead of a PICH of said first plurality so that each PICH of said second plurality is connected to each PICH of said first plurality, wherein each second-plurality PICH has fewer than one half of all its programmable leads connected to one or more contacts on said board for contacting one or more user components.

2. The structure of claim 1 wherein each second-plurality PICH has fewer than one third ($\frac{1}{3}$) of all its programmable leads connected to one or more contacts on said board for contacting one or more user components.

3. The structure of claim 2 wherein less than one third ($\frac{1}{3}$) of all the programmable leads of each PICH of said first plurality are connected by interconnects to programmable leads of PICHs of said second plurality.

4. The structure of claim 2 wherein each PICH of said first plurality comprises:
at most 350 programmable leads connected by interconnects to programmable leads of said PICHs of said second plurality; and
at least 600 programmable leads connected by interconnects to one or more of said user-component contacts.

5. The structure of claim 1 wherein each second-plurality PICH has no programmable lead connected to a contact on said board for contacting a user component.

6. The structure of claim 1 wherein less than one half of all the programmable leads of each PICH of said first plurality are connected by interconnects to programmable leads of PICHs of said second plurality.

7. The structure of claim 6 wherein more than one half of all the programmable leads of each PICH of said first plurality are connected by interconnects to one or more of said user-component contacts.

8. The structure of claim 1 further comprising one or more user components contacting one or more of said user-component contacts.

9. The structure of claim 8 wherein each user component contacting one or more of said user-component contacts is connected, by one or more interconnects, to only one PICH of said first plurality.

10. The structure of claim 9 wherein at least two user components contacting one or more of said user-component contacts are connected by interconnects to the same PICH of said first plurality.

11. The structure of claim 9 wherein one or more of said user components contacting one or more of said user-component contacts are field programmable gate arrays.

12. The structure of claim 1 wherein each said interconnect comprises a printed conductive trace in said first circuit board.

13. The structure of claim 1 wherein for any group of disjoint subsets of programmable leads of each said PICH, said PICH can be programmed to electrically connect together the pins of each subset while electrically isolating the subsets from each other.

14. The structure of claim 1 wherein each said PICH comprises at least 900 programmable leads.

15. The structure of claim 14 wherein each PICH of said first plurality comprises:
at least 100 programmable leads connected by said interconnects to the PICHs of said second plurality; and
at least 700 programmable leads connected by said interconnects to said contacts for contacting one or more user components.

16. The structure of claim 1 further comprising means for connecting one or more of said PICHs to one or more devices off said first circuit board.

17. The structure of claim 16 wherein said means is for connecting one or more of said PICHs of said second plurality to one or more devices off said first circuit board.

18. The structure of claim 17 wherein one or more of said devices each comprise a PICH.

19. The structure of claim 16 wherein said means comprises:
an I/O port; and
one or more I/O buffers for actively driving signals between one or more of said PICHs and said I/O port.

20. The structure of claim 1 further comprising:
a connector mounted on said first circuit board and connected to one or more of said PICHs; and
a second circuit board connected to said connector.

21. The structure of claim 20 further comprising one or more PICHs each of which has a plurality of programmable leads contacting said second circuit board one or more of which leads are connected to said connector, wherein each said PICH of said second board can programmably connect any one of its programmable leads to another one of its programmable leads.

22. The structure of claim 21 wherein:
said second board comprises one or more contacts for contacting one or more user components;
said structure further comprises one or more conductive interconnects connecting one or more programmable leads of each said PICH of said second circuit board to one or more of said contacts of said second circuit board; and
said connector electrically connects each said PICH of said second circuit board to each PICH of said second plurality.

23. The structure of claim 1 wherein each said PICH can pass signals having any voltage from 0.0 V to 5.0 V.

24. The structure of claim 1 wherein each said PICH is reprogrammable.

25. A structure comprising:
a first circuit board;
a plurality of contacts on said first circuit board for contacting one or more user components;
a first plurality of programmable interconnect chips (PICHs) each of which has a plurality of programmable leads contacting said circuit board such that each said PICH can programmably connect any one of its programmable leads to another one of its programmable leads;

a first plurality of conductive interconnects each of which connects one of said user-component contacts to a programmable lead of a PICH of said first plurality so that each PICH of said first plurality has a programmable lead connected to one or more of said user-component contacts;

a second plurality of PICHs each of which has a plurality of programmable leads contacting said first circuit board and such that each PICH of said second plurality can programmably connect any one of its programmable leads to another one of its programmable leads; and a second plurality of conductive interconnects each of which connects a programmable lead of a PICH of said second plurality to a programmable lead of a PICH of said first plurality so that each PICH of said second plurality is connected to each PICH of said first plurality, wherein each PICH of said second plurality is programmed to electrically interconnect at least two of its programmable leads connected by interconnects to one or more PICHs of said first plurality.

26. The structure of claim 25 wherein each PICH of said first plurality has more than one programmable leads connected by interconnects to PICHs of said second plurality, and wherein each PICH of said first plurality does not connect together its multiple programmable leads connected by interconnects to PICHs of said second plurality.

27. The structure of claim 26 further comprising one or more user components contacting one or more of said contacts.

28. A programmable interconnect system comprising:
a circuit board;
a plurality of contacts on said circuit board for contacting one or more user components;
a first plurality of contacts on said circuit board for contacting programmable interconnect chips (PICHs);
a plurality of local programmable interconnect chips each of which has a plurality of leads each of which contacts a contact of said first plurality;
a first plurality of conductive interconnects each of which connects one of said user-component contacts to a contact of said first plurality so that each said local PICH is connected to one or more of said user-component contacts;
a second plurality of contacts on said circuit board for contacting programmable interconnect chips;
a plurality of global programmable interconnect chips each of which has a plurality of leads each of which contacts a contact of said second plurality; and
a second plurality of conductive interconnects each of which connects a contact of said first plurality to a contact of said second plurality so that each said local PICH is connected to each said global PICH.

29. A programmable interconnect system comprising:
a plurality of circuit boards;
a plurality of contacts on one or more of said circuit boards for contacting one or more user components;
a first plurality of contacts on one or more of said circuit boards for contacting programmable interconnect chips (PICHs);
a plurality of local programmable interconnect chips each of which has a plurality of leads each of which contacts a contact of said first plurality;
a second plurality of contacts on one or more of said circuit boards for contacting programmable interconnect chips;
a plurality of global programmable interconnect chips each of which has a plurality of leads each of which contacts a contact of said second plurality; and
means for interconnecting said contacts so as to connect each said local PICH to one or more of said user-component contacts and to each said global PICH,
wherein each said board has on it one or more of said contacts connected by said interconnecting means to one or more of said contacts on another one of said boards.

30. A method for determining how to program a structure comprising;
a first circuit board;
a plurality of contacts on said circuit board for contacting one or more user components;
a first plurality of programmable interconnect chips (PICHs) each of which has a plurality of programmable leads contacting said first circuit board such that each PICH can programmably connect any one of its programmable leads to another one of its programming leads;
a first plurality of conductive interconnects each of which connects one of said user-component contacts to a programmable lead of a PICH of said first plurality so that each said PICH has a programmable lead connected to one or more of said user-component contacts;
a second plurality of PICHs each of which has a plurality of programmable leads contacting said first circuit board such that each PICH of said second plurality can programmably connect any one of its programmable leads to another one of its programmable leads;
a second plurality of conductive interconnects each of which connects a programmable lead of a PICH of said second plurality to a programmable lead of a PICH of said first plurality so that each PICH of said second plurality is connected to each PICH of said first plurality; and
one or more user components contacting one or more of said user-component contacts,
wherein each second-plurality PICH has fewer than one half of all its programmable leads connected to one or more contacts on said board for contacting one or more user components, and wherein one or more of said user components are programmable logic devices with one or more assignable pins, said method comprising the steps of:
determining how to program said one or more programmable logic devices, said determining step comprising assigning said one or more assignable pins; and then
based on assignment of said one or more assignable pins and a netlist, determining how to program said PICHs to implement said netlist.

31. The method of claim 30 wherein said step of determining how to program said PICHs comprises the steps of:

determining which nets, if any, of said netlist are to be routed through a PICH of said second plurality; and then routing one or more of said PICHs to implement said netlist.

32. A structure comprising:
a plurality of user components;
a first plurality of programmable interconnect circuits (PIs) each of which comprises a plurality of programmable leads such that each PI can programmably connect any one of its programmable leads to another one of its programmable leads, each PI being connected to a user component;
a second plurality of PIs each of which has a plurality of programmable leads such that each PI of the second plurality can programmably connect any one of its programmable leads to another one of its programmable leads;
a plurality of conductive interconnects each of which connects a unique programmable lead of a PI of the first plurality to a unique programmable lead of a PI of the second plurality so that each programmable lead of each PI of the first plurality is connected by an interconnect to at most one of the programmable leads of the PIs of the second plurality and each programmable lead of each PI of the second plurality is connected by an interconnect to one and only one of the programmable leads of the PIs of the first plurality,
wherein the interconnects connect each PI of the first plurality to each PI of the second plurality.

33. The structure of claim 1 wherein each interconnect of the second plurality connects a unique programmable lead of a PICH of the second plurality to a unique programmable lead of a PICH of the first plurality so that each programmable lead of each PICH of the first plurality is connected by an interconnect to at most one of the programmable leads of the PICHs of the second plurality and each programmable lead of each PICH of the second plurality is connected by an interconnect to at most one of the programmable leads of the PICHs of the first plurality.

* * * * *